US006226335B1

(12) United States Patent
Prozorov

(10) Patent No.: US 6,226,335 B1
(45) Date of Patent: May 1, 2001

(54) METHODS AND APPARATUS FOR AUTOMATIC FREQUENCY CONTROL IN WIRELESS RECEIVERS

(75) Inventor: Robert B. Prozorov, Holland, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/129,653

(22) Filed: Aug. 5, 1998

(51) Int. Cl.[7] .................................................. H04L 27/06
(52) U.S. Cl. ............................................................. 375/344
(58) Field of Search ........................... 455/182.1, 164.1, 455/234.1, 192.1, 257; 375/344; 348/735

(56) References Cited

U.S. PATENT DOCUMENTS 4,485,404 * 11/1984 Tults ...................................... 348/735
4,607,230 * 8/1986 Kaku et al. ............................ 375/376

* cited by examiner

*Primary Examiner*—Chi Pham
*Assistant Examiner*—Kevin M. Burd
(74) *Attorney, Agent, or Firm*—Priest & Goldstein, PLLC

(57) ABSTRACT

An automatic frequency control system including a binary non-resettable counter which counts periods of a reference signal. The system achieves control in two or more stages, including at least a coarse stage and a fine stage. A frequency divider generates AFC integration periods inversely proportional to the controlled frequency. A frequency divider includes a resettable counter which counts the number of periods of the controlled frequency and when the number of periods counted matches a stored integration period count value, the resettable counter is reset and the non-resettable counter is read. Switching between the coarse stage and the fine stage is based on an error count computed from the output of the non-resettable counter. A value 'Error Correction' is produced based on the value 'Error Count'. A new value 'Ctrl' is produced based on the value 'Error Correction' and the control value 'Ctrl' during the previous AFC cycle. The value 'Ctrl' is supplied as a control input to a controlled synthesizer to set the frequency of a controlled signal.

15 Claims, 2 Drawing Sheets

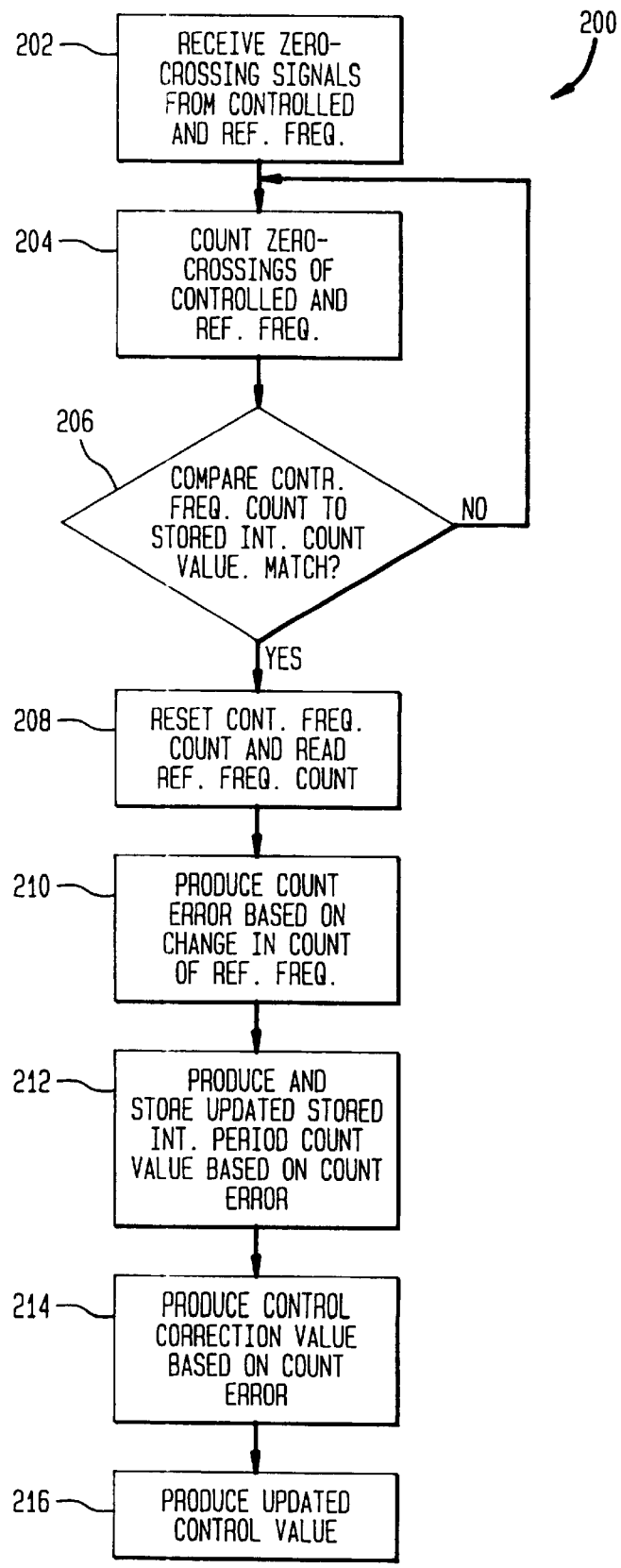

METHODS AND APPARATUS FOR AUTOMATIC FREQUENCY CONTROL IN WIRELESS RECEIVERS

FIELD OF THE INVENTION

The present invention relates generally to improvements to wireless receivers. More particularly, the invention relates to the advantageous use of a non-resettable counter for automatic frequency control in wireless receivers.

BACKGROUND OF THE INVENTION

Most wireless receivers employ automatic frequency control (AFC) for the fine tuning of the internal frequency synthesizer to the carrier frequency. In the prior art, the frequency of the carrier is usually measured with a resettable counter, which counts the number of zero-crossings of the input signal over a given period of time. In order to achieve a high accuracy with this method it is necessary to employ a high-order counter. Moreover, reset of the counter introduces a quantization error.

There exists, therefore, a need in the art for a system of automatic frequency control which can be implemented by a lower-order counter and which is not susceptible to quantization error.

SUMMARY OF THE INVENTION

An automatic frequency control system according to the present invention may suitably include a binary N-order non-resettable counter which counts periods of a reference signal. A non-resettable counter rolls over to zero when it reaches its maximum value of $2^N$. A frequency divider generates AFC integration periods inversely proportional to the controlled frequency (proportional to the periods of the controlled signal). A frequency divider includes a resettable counter which counts the number of periods of the controlled frequency and when the number of periods counted matches a stored integration period count value "D", the resettable counter is reset and the non-resettable counter is read.

Frequency control is advantageously achieved in two (or more) stages. The stages preferably include at least a coarse stage and the fine stage. Switching between the coarse stage and the fine stage is based on an error count computed from the output of the non-resettable counter. The stored frequency divider integration period count value is D. The integration count period D is set based on the error count and controls switching between the coarse stage and the fine stage by controlling how many periods of the controlled frequency must occur between readings of the non-resettable counter. In the coarse stage, the integration period is close to $2^N * F_{REF}$, allowing the non-resettable counter to roll over one time during the integration period. In the fine stage, the integration period is close to $K*2^N*F_{REF}$, where K is an integer greater than 1. Use of the integration period $K*2^N$ allows the non-resettable counter to rollover K times during the integration period. Frequency error, or count error ('Error Count') is computed based on a difference between the current reading of the non-resettable counter and its previous reading. An error correction value 'Error Correction' is produced based on the value 'Error Count'. A new control value 'Ctrl' is produced based on the value 'Error Correction' and the control value 'Ctrl' during the previous AFC cycle. The value 'Ctrl' is supplied as a control input to a controlled synthesizer to set the frequency of a controlled signal. The control value is computed according to the following equation:

$$Ctrl(n) = Ctrl(n-1) + Correction$$

Where:
Ctrl(n)=new control value in current AFC cycle
Ctrl(n−1)=control value from the previous AFC cycle
Correction=Correction Value $$Correction = [Error\ Count + Error\ Correction] * Gain$$

Where:
Gain=AFC loop gain
Error Count=error computed based on two consecutive readings of the non-resettable counter, as follows $$Error\ Count = C(n) - C(n-1)$$

Where:
C(n)=reading of the non-resettable counter in current AFC cycle
C(n−1)=previous reading of the non-resettable counter
The value 'Error Correction' is a constant value for the value 'Error Count' computed based on difference of the controlled frequency and the reference frequency and each set of K and D values for each AFC stage, as follows:

$$Error\ Correction = (K*2^N - D*F_{REF}/F_{CTRL})$$

Where:
N is the binary order of the non-resettable counter
K is an integer K=1 for the coarse stage, K>1 for fine stage
D is the integration period value of the frequency divider, chosen for each given K to minimize the value 'Error Correction'.
$F_{REF}$ is a reference frequency
$F_{CTRL}$ is a desired controlled frequency
Combining all equations above, the value 'Ctrl' may be stated as:

$$Ctrl\ (n) = Ctrl(n-1) + [C(n) - C(n-1) + (K*2^N - D*F_{REF}/F_{CTRL})]*Gain$$

In cases when non-resettable counter rolls over between two consecutive readings, error count becomes close to $2^N$, such condition is detected by a rollover detector by comparing if the error count is greater than $2^{N-1}$. In this case, suspension of automatic frequency control is achieved by setting the error count equal to zero.

A more complete understanding of the present invention, as well as further features and advantages of the invention, will be apparent from the following Detailed Description of a presently preferred embodiment and the accompanying drawings.

BRIEF DESCRIPTION OF THE DRAWINGS

FIG. 2 is a flowchart illustrating the steps of a method of automatic frequency control according to the present invention.

DETAILED DESCRIPTION

Figure 1:
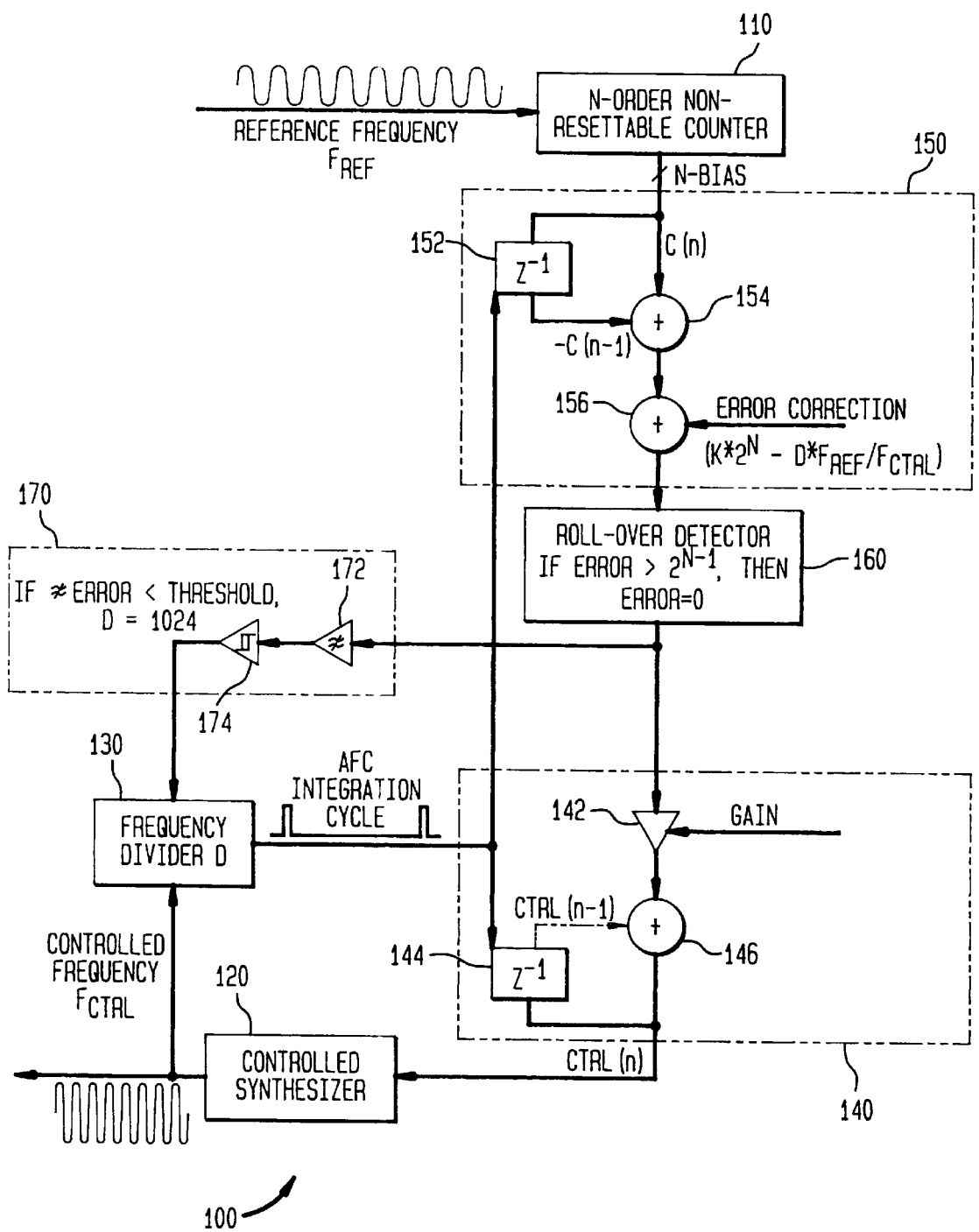
FIG. 1 illustrates an automatic frequency control system according to the present invention.

FIG. 1 illustrates an automatic frequency control system 100 according to the present invention. The frequency control system 100 performs frequency control in two stages. The automatic frequency control system 100 makes a coarse adjustment, followed by a fine adjustment once the frequency is in an acceptable range. The frequency control system 100 is based on an 8-bit non-resettable counter 110. The non-resettable counter 110 receives a reference frequency, preferably set to 50 kHz. In the present example, the controlled frequency is adjusted to 40 kHz. The frequency control system 100 operates in two stages, a coarse stage and a fine stage. For the coarse stage, an integer value K is set equal to 1. The frequency control system also includes a frequency divider 130 having an integration period value D chosen to minimize error correction for the controlled signal. The integration period value D is initially set to 205, in order to yield the lowest value for the variable 'Error Correction' mentioned above. Setting the integration period D to 205 yields the following:

$$\text{Error Correction} = (K*2^N - D*F_{REF}/F_{CTRL}) = (1*2^8 - 205*50 \text{ kHz}/40 \text{ kHz})$$

This yields for 'Error Correction' a value of −0.25.

The non-resettable counter 110 increments every period in the reference frequency. After the non-resettable counter 110 reaches a value of $2^N=255$, it rolls over to 0. The frequency control system 100 also includes controlled synthesizer 120, a frequency divider 130 and a control value generator 140. The controlled synthesizer 120 produces a frequency proportional to the value received from the control value generator 140. The frequency divider 130 divides the controlled frequency by the preset value D to produce an AFC Cycles signal for reading the non-resettable counter and computing a new control value. At each AFC cycle, the non-resettable counter 110 is read by an error determination unit 150. The error determination unit 150 includes a unit delay component 152, a differentiation component 154 and an error correction component 156. The unit delay component 152 reads the value C from the non-resettable counter 110 at each AFC cycle and stores it in memory to provide it to differentiation component 154 at the next AFC cycle. The differentiation component 154 also reads non-resettable counter 110 at each AFC cycle and instantly computes a difference between the current value of the non-resettable counter 110 and the previous value of the non-resettable counter 110 received from the unit delay component 152. The output of the differentiation component 154 is provided to an error correction component 156. The error correction component 156 receives the value 'Error Count' from the differentiation component 154 and adds the value 'Error Correction' to produce a corrected value for 'Error Count'.

The frequency control system 100 further includes a rollover detector 160 to detect AFC cycles when the non-resettable counter 100 rolls over to zero. The rollover detector 160 receives the corrected error value from the error determination unit 150. The rollover detector 160 compares the corrected value of 'Error Count' to the range −127 to +127. If the corrected value 'Error Count' is greater than 127 or is less than −127, the rollover detector 160 assumes that this error is caused by a rollover of the non-resettable counter 110. In this case the rollover detector 160 replaces the received value of 'Error Count' with a value of 'Error Count' equal to zero, suspending the AFC process for the current AFC cycle. If the corrected value 'Error Count' is within the +/−127 range, the rollover detector 160 does not affect that value, assuming that errors less than 127 are true errors. The rollover detector 160 provides the value 'Error Count' to the control value generator 140.

The control value generator 140 includes a gain component 142, a unit delay component 144 and a control value corrector 146. The Gain component 142 receives an error value from the rollover detector 160 and multiplies it by the AFC loop gain value to produce a gained error value. The gained error value is provided to a correction component 146. The unit delay component 144 receives the gained error value from the correction component 146 and stores the value for the next AFC cycle. The unit delay component 144 provides its content, which is an AFC control value from the previous AFC cycle, to the second input of the control value corrector 146. The control value corrector 146 adds values from the unit delay component 144 and the gain component 142 to produce a new value 'Ctrl' in the current AFC cycle. The control value corrector 146 provides the new value 'Ctrl' to the inputs of the controlled synthesizer 120.

The frequency control system 100 further includes a range switching unit 170. The range switching unit 170 includes an averaging component 172 and a comparator 174. The averaging component 172 receives its input from rollover detector 160 and performs averaging of the corrected errors for a given period of time. The comparator 174 receives an averaged error from the averaging component 172 and compares it to a given threshold value. If an averaged error is less than the threshold value, the comparator 174 switches AFC to the fine stage by setting the value D=1024 in the frequency divider 130, to match K=5 chosen for the fine stage. The 'Error Correction' value for the fine stage is calculated as follows:

$$\text{Error Correction} = (K*2^N - D*F_{REF}/F_{CTRL}) = (5*2^8 - 1024*50 \text{ kHz}/40 \text{ kHz}) = 0.$$

FIG. 2 is a flowchart illustrating the steps of a method 200 of automatic frequency control according to the present invention. At step 202, zero-crossing signals from the controlled frequency and a reference (carrier) frequency are received. At step 204, the zero-crossings of the controlled and the reference (carrier) frequency are counted. The reference (carrier) frequency count is not resettable. At step 206, the controlled frequency count is compared to a stored integration period count value. If the controlled frequency count does not match the integration period count value, control is returned to step 204 and counting continues. If the controlled frequency count matches the stored integration period count value, control is transferred to step 208, the controlled frequency count is reset and the reference (carrier) frequency count is read. At step 210, the reference (carrier) frequency count is subjected to a delay to produce a delayed reference (carrier) frequency count, and the reference (carrier) frequency count is compared to the delayed reference (carrier) frequency count to produce a count error. At step 212, the count error is corrected by the error correction value and then is evaluated. The stored integration period count value is updated based on the corrected count error. For a controlled frequency of 40 kHz and a reference (carrier) frequency of 50 kHz, the stored interrupt count value is preferably set to 1024 for a fine correction stage and to 205 for a coarse correction stage.

At step 214, the count error is evaluated and used to produce a control correction value. At step 216, the control correction value is used to produce a new control value which is preferably supplied to a controlled synthesizer.

While the present invention is disclosed in the context of a presently preferred embodiment, it will be recognized that a wide variety of implementations may be employed by persons of ordinary skill in the art consistent with the above discussion and the claims which follow below. For example, while particular frequencies and values have been described, these frequencies and values may be varied to suit the intended environment.

I claim:

1. An automatic frequency control system for use in wireless telephone system, comprising:
    a first counter for counting a number of periods of a controlled frequency received by the frequency control system;
    a second counter for counting zero crossings of a reference frequency signal received by the frequency control system, the second counter being a non-resettable counter;
    a count control responsive to the first counter for resetting the first counter and directing a reading of the second counter when the number of periods of the controlled frequency reaches a stored integration period count value;
    an error detector for tracking a count produced by the second counter and determining a count error and setting the stored integration period count value depending on the count error;
    an error corrector for receiving the count error and producing an error correction value based on the count error, the error corrector being operative to add the error correction value to the count error to produce a corrected count error;
    a control value generator for producing a control value based on the corrected count error; and
    a controlled synthesizer for producing a frequency based on the control value.

2. The frequency control system of claim 1 wherein the stored integration period count value is one of a fine control value and a coarse control value depending on the count error.

3. The frequency control system of claim 2 wherein the error correction value is computed using the stored integration period count value.

4. The frequency control system of claim 3 wherein the error detector includes a delay for receiving the count and producing a delayed count, and wherein the error detector determines the count error based on a difference between the count and the delayed count.

5. The frequency control system of claim 4 wherein the delay is a unit delay.

6. The frequency control system of claim 5 further comprising a rollover detector which receives the error corrected error count value from the error corrector and resets the corrected error count value to 0 if the error count value received from the error corrector exceeds a predetermined maximum.

7. The frequency control system of claim 6 wherein the predetermined maximum is $2^{N-1}$, where N is a number of counts readable by the second counter.

8. The frequency control system of claim 7 wherein the frequency control system is set to one of a coarse stage and a fine stage depending on the error count, where the error correction value is computed using the coarse control value during the coarse stage and the fine control value during the fine stage.

9. The frequency control system of claim 8 wherein the error correction value is computed using the equation Error Correction=$(K*2^N - D*F_{REF}/F_{CTRL})$, where N is a maximum readable value of the reference frequency count, K is a constant set depending on whether the frequency control system is operating in the coarse stage or the fine stage, D is the stored integration period count, $F_{REF}$ a number of zero crossings of the reference frequency indicated by the second counter and $F_{CTRL}$ is a number of periods of the controlled frequency indicated by the first counter.

10. The frequency control system of claim 9 wherein the constant K has a value of 1 during the coarse stage and a value of 5 during the fine stage, and wherein the stored integration period count D has a value of 205 during the coarse stage and a value of 1024 during the fine stage.

11. A method of automatic frequency control comprising the steps of:
    (a) receiving a controlled frequency signal and a reference frequency signal;
    (b) maintaining a controlled frequency count and a reference frequency count, the reference frequency count being non-resettable;
    (c) comparing the controlled frequency count against a stored integration count value, resetting the controlled frequency count and reading the reference frequency count if the controlled frequency count matches the stored integration period count value and returning to step (b) if the controlled frequency count does not match the stored value;
    (d) producing a count error based on a difference between the reference frequency count and a delayed reference frequency count;
    (e) producing and storing a stored integration period count value based on the count error;
    (f) producing an error correction value based on the count error; and
    (g) producing a control value based on the error correction value and the previous control value.

12. The method of claim 11 wherein a coarse adjustment or a fine adjustment is made depending on the count error.

13. The method of claim 12 wherein the stored integration period value is set according to whether the count error indicates a coarse adjustment or a fine adjustment.

14. The method of claim 13 wherein the error correction value is computed according to the formula Error Correction=$(K*2^N - D*F_{REF}/F_{CTRL})$, where N is a number of counts readable by the second counter, K is a constant set depending on whether the count error indicates a coarse adjustment or a fine adjustment, D is the stored integration period count value, $F_{REF}$ is the reference frequency count and $F_{CTRL}$ is the controlled frequency count.

15. The method of claim 14 wherein the value of K is set to 1 when the count error indicates a coarse adjustment and to 5 when the count error indicates a fine adjustment and wherein the stored integration period count value D is set to 205 when the count error indicates a coarse adjustment and to 1024 when the count error indicates a fine adjustment.

* * * * *